(12) United States Patent
Okada et al.

(10) Patent No.: US 6,486,817 B1
(45) Date of Patent: Nov. 26, 2002

(54) DIGITAL-ANALOG CONVERSION CIRCUIT CAPABLE OF FUNCTIONING AT A LOW POWER SUPPLY VOLTAGE

(75) Inventors: Hirokazu Okada; Tachio Yuasa, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/706,714

(22) Filed: Nov. 7, 2000

(30) Foreign Application Priority Data

Nov. 8, 1999 (JP) ............................................. 11-317074

(51) Int. Cl.[7] ................................................ H03M 1/78
(52) U.S. Cl. ........................................ 341/154; 341/144
(58) Field of Search ................................... 341/154, 144

(56) References Cited

U.S. PATENT DOCUMENTS 5,252,975 A * 10/1993 Yuasa et al. ................. 341/145
5,568,147 A * 10/1996 Matsuda et al. ............. 341/154

FOREIGN PATENT DOCUMENTS

JP          62-227224         10/1987   ............ H03M/1/68

* cited by examiner

*Primary Examiner*—Peguy Jeanpierre
(74) *Attorney, Agent, or Firm*—Arent Fox Kintner Plotkin & Kahn, PLLC (57) ABSTRACT

A resistor string digital-analog conversion circuit includes three resistor strings connected in series, a controller, and a switch group. The controller controls switchover of the switch group according to a signal of m high-order bits of an input digital signal. Thus an analog output corresponding to the m high-order bits is obtained. Another controller varies potentials of two variable voltage sources according to a signal of n low-order bits of the input digital signal, while always keeping a potential difference across the three resistor strings constant. Thus an analog output corresponding to the n low-order bits is obtained. This analog output is output to an output terminal.

9 Claims, 6 Drawing Sheets

DIGITAL-ANALOG CONVERSION CIRCUIT CAPABLE OF FUNCTIONING AT A LOW POWER SUPPLY VOLTAGE

FIELD OF THE INVENTION

The present invention relates to a digital-analog conversion circuit which converts a digital signal to an analog signal.

BACKGROUND OF THE INVENTION

In portable devices such as portable telephones, the digital-analog conversion circuit is integrated in a semiconductor integrated circuit such as a radio IC. In recent years, as the process of integrated circuits have become finer. As a consequence, power supply voltage which is used in the integrated circuits has also lowered. Therefore, digital-analog circuits which can work at a low power supply voltage are in demand.

Figure 1:
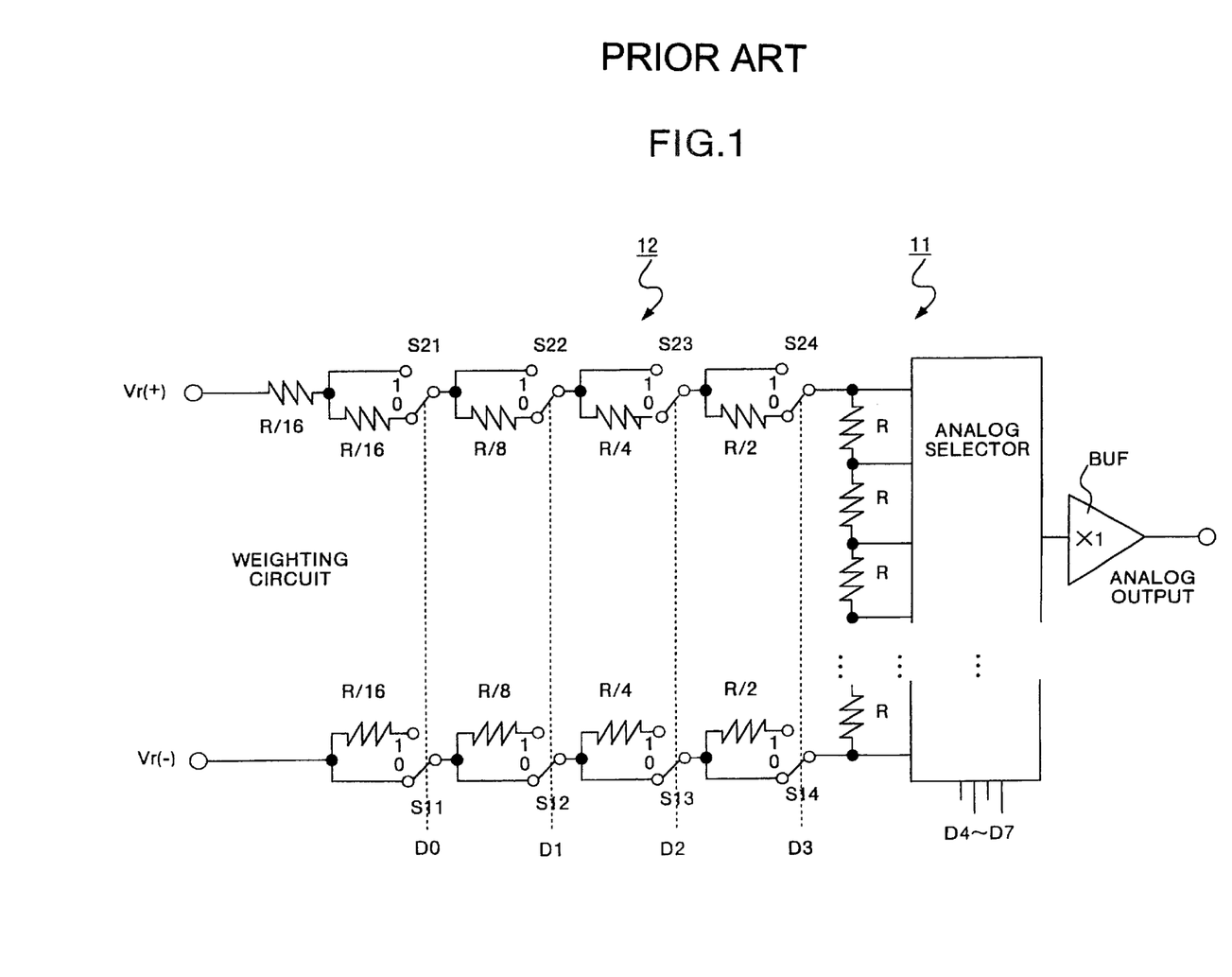
FIG. 1 is a circuit diagram showing a conventional digital-analog conversion circuit.

Digital-analog conversion circuits obtained by combining a resistor string digital-analog converter and weighted resistors are known (See for example, Japanese Patent Application Laid-Open Publication No. 62-227224). FIG. 1 is a diagram showing a conventional digital-analog conversion circuit (for 8 bits) disclosed in Japanese Patent Application Laid-Open Publication No. 62-227224.

This digital-analog conversion circuit includes a resistor string digital-analog conversion section 11 and a binary weighting circuit 12 having resistor groups which consist of weighted value resistors and switch groups which is connected to the weighted value resistors. The digital-analog conversion section 11 receives n high-order bits (for example, D4, . . . , D7) of an input digital value, and outputs an analog voltage corresponding thereto.

A resistor group and a switch group of the binary weighting circuit 12 are inserted between a positive power supply side of a resistor string included in the digital-analog conversion section 11 and a positive power supply (Vr(+)). A resistor group and a switch group of the binary weighting circuit 12 are inserted also between a negative power supply side of the resistor string and a negative power supply (Vr(−)). Each of the weighted value resistors of the resistor group is inserted or removed by a switch group. Switches S11 to S14 and S21 to S24 of the switch groups are, for example, MOS transistors.

The binary weighting circuit 12 receives m low-order bits (for example, D0, . . . , D3) of the input digital value. According to insertion and removal of the weighted value resistors conducted by the switch groups, the binary weighting circuit 12 outputs a potential obtained by dividing a voltage corresponding to one step of the digital-analog conversion section 11 by $\frac{1}{2}^m$. In the digital-analog conversion circuit shown in FIG. 1, therefore, $2^{m+n}$ steps are obtained.

In the above described conventional digital-analog conversion circuit, the switch groups of the binary weighting circuit 12 are connected in series with the resistor string included in the digital-analog conversion section 11. A voltage variation corresponding to low-order bits of the input digital value is adjusted by switching over the switches S11 to S14 and S21 to S24 of the switch groups. Therefore, the conversion precision of this digital-analog conversion circuit is influenced by on-resistance values of the switches S11 to S14 and S21 to S24.

Therefore, there is a problem that the circuit area needs to be increased for activating the above described conventional digital-analog conversion circuit at a low power supply voltage. The reason is as follows. If the power supply voltage becomes low, the voltage of a control signal for turning gates of MOS transistors forming the switches on is lowered. For suppressing the maximum on-resistance to such a level as not to exert a serious influence on the digital-analog conversion precision, therefore, the gate area must be increased.

SUMMARY OF THE INVENTION

It is an object of the present invention to provide a digital-analog conversion circuit capable of suppressing an increase of the circuit area even in the case where it is activated with a low power supply voltage.

The-digital-analog conversion circuit according to the present invention has such a configuration that a potential at an arbitrary node in the resistor string is changed by changing potentials of both ends while keeping a potential difference across the resistor string constant.

Figure 2:
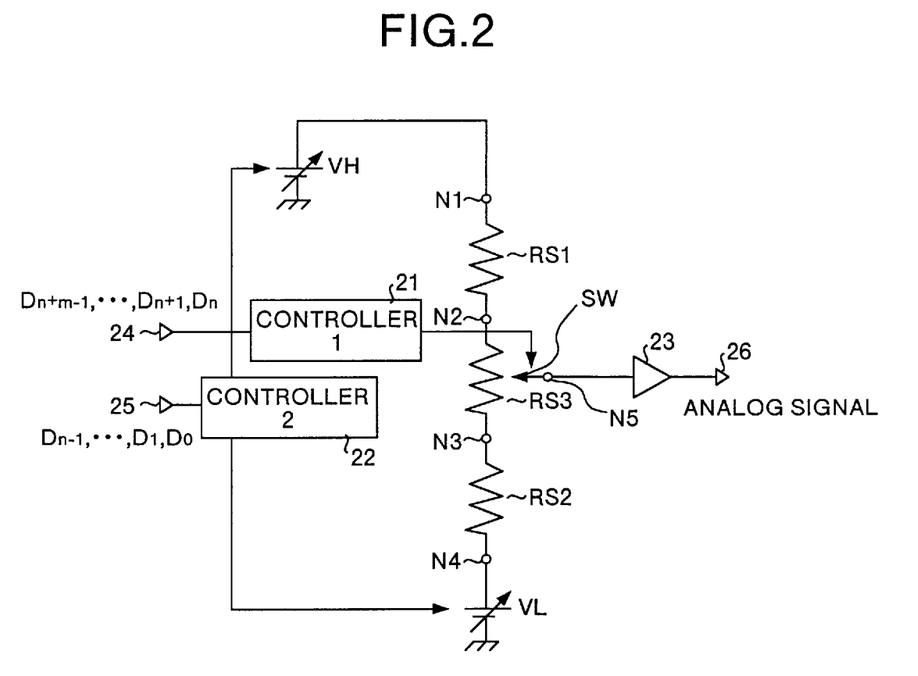
FIG. 2 is a circuit diagram showing a conventional digital-analog conversion circuit according to the present invention according to the present invention.

FIG. 2 is a circuit diagram which describes the principle of a digital-analog conversion circuit according to the present invention. This digital-analog conversion circuit includes resistor strings RS1, RS2 and RS3, a first controller (controller 1) 21, a second controller (controller 2) 22, a switch group SW, a first variable voltage source VH, a second variable voltage source VL, a buffer 23, input terminals 24 and 25, and an output terminal 26. Legends N1, N2, N3, N4 and N5 denote nodes, respectively.

The first resistor string RS1 is connected in series between the node N1 and the node N2. The second resistor string RS2 is connected in series between the node N3 and the node N4. The third resistor string RS3 is connected in series between the node N2 and the node N3. Therefore, the three resistor strings RS1, RS2 and RS3 are connected in series.

The first input terminal 24 is supplied with m high-order bits (for example, Dn+m−1, . . . , Dn+1, Dn) of an input digital signal. The second input terminal 25 is supplied with n low-order bits (for example, Dn−1, . . . , D1, D0) of the input digital signal.

The first controller 21 controls switchover of the switch group SW according to the m high-order bits of the input signal. The resistor strings RS1, RS2, and RS3, the first controller 21, and the switch group SW form a digital-analog conversion circuit of resistor string type. By using the digital-analog conversion circuit of resistor string type, an analog output corresponding to m high-order bits of the input digital signal is obtained.

The second controller 22 controls potentials of two variable voltage sources VH and VL so as to make the potential difference between the node N1 and the node N4 always constant. Here, the first variable voltage source VH applies a potential of a relatively high level to the node N1. The second variable voltage source VL applies a potential of a relatively low level to the node N4.

As a result of variation of the potentials of the two variable voltage sources VH and VL controlled by the second controller 22, an analog output corresponding to the n low-order bits of the input digital signal is obtained. The analog signal corresponding to the input digital signal is outputted to the output terminal 26 through the node N5 and the buffer 23.

Figure 3:
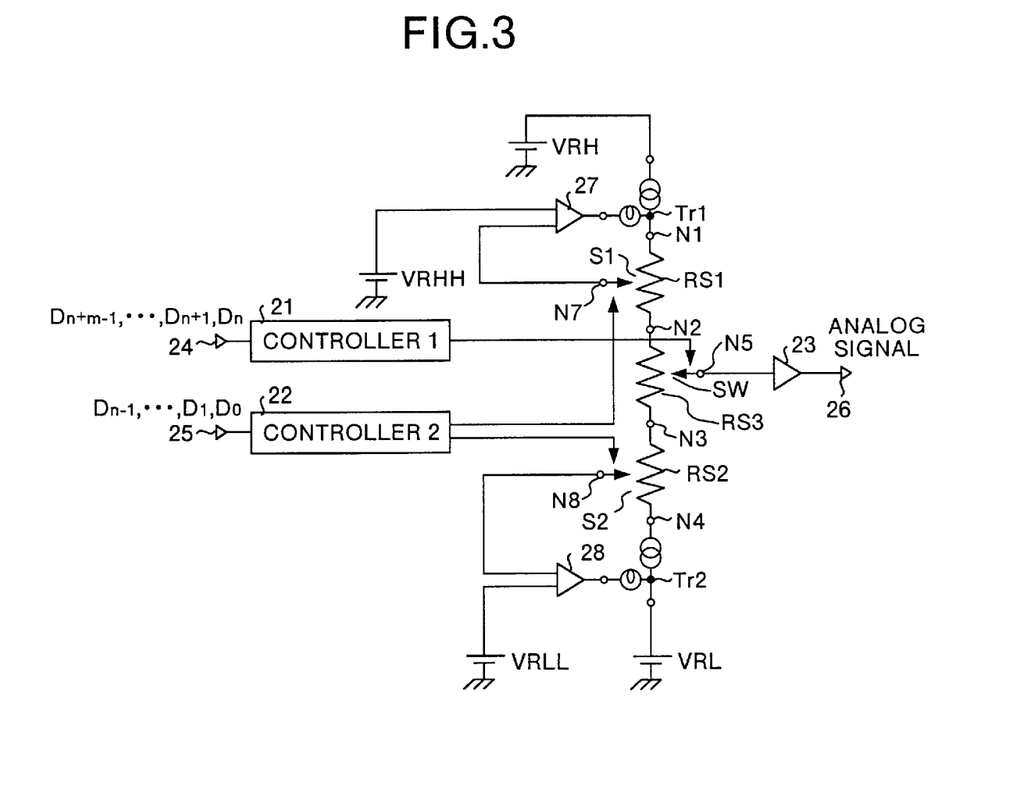
FIG. 3 is a circuit diagram showing the principle of a digital-analog conversion circuit according to the present invention.

FIG. 3 is a circuit diagram showing the principle of the digital-analog conversion circuit according to the present invention in more detail. FIG. 3 shows in more detail the variable voltage sources VH and VL of the digital-analog conversion circuit shown in FIG. 2. In this figure, components that are common to those in FIG. 2 are provided like legends and description thereof is omitted.

In the example shown in FIG. 3, the variable voltage source VH (see FIG. 2) includes a first constant-voltage source VRH, a second constant voltage source VRHH, a first differential amplifier 27, a first transistor Tr1, and a first switch group S1. The first transistor Tr1 is connected between the node N1 and the first constant voltage source VRH. The first transistor Tr1 operates on the basis of an output signal of the first differential amplifier 27.

One input terminal of the first differential amplifier 27 is connected to the second constant voltage source VRHH. The other input terminal of the first differential amplifier 27 is connected to a suitable place of the first resistor string RS1 through the first switch group S1. Switchover operation of the first switch group S1 is controlled by the second controller 22.

N7 is a node connected to the first resistor string RS1 via the first switch group S1. A potential at the node N7 is subjected to feedback control by the first differential amplifier 27 so as to be equal to a potential at the second constant voltage source VRHH by a norator action of the first transistor Tr1.

In the example shown in FIG. 3, the variable voltage source VL (see FIG. 2) includes a third constant voltage source VRL, a fourth constant voltage source VRLL, a second differential amplifier 28, a second transistor Tr2, and a second switch group S2. The second transistor Tr2 is connected between the node N4 and the third constant voltage source VRL. The second transistor Tr2 operates on the basis of an output signal of the second differential amplifier 28.

One input terminal of the second differential amplifier 28 is connected to the fourth constant voltage source VRLL. The other input terminal of the second differential amplifier 28 is connected to a suitable place of the second resistor string RS2 through the second switch group S2. Switchover operation of the second switch group S2 is controlled by the second controller 22.

N8 is a node connected to the second resistor string RS2 via the second switch group S2. A potential at the node N8 is subjected to feedback control by the second differential amplifier 28 so as to become equal to a potential at the fourth constant voltage source VRLL by a norator action of the second transistor Tr2.

Owing to such a configuration, a potential difference between the suitable node of the first resistor string RS1 connected to the node N7 by the first switch group S1 and the suitable node of the second resistor string RS2 connected to the node N8 by the second switch group S2 always becomes a constant value V7-8.

Here, the second controller 22 has such a configuration as to control the switchover operation of the first and second switch groups S1 and S2 in order that the resistance between the suitable node of the first resistor string RS1 connected to the node N7 and the suitable node of the second resistor string RS2 connected to the node N8 always becomes a constant value R7-8.

Therefore, a current I flowing through the three resistor strings RS1, RS2 and RS3 connected in series always becomes a constant value, and it is represented by the following equation 1.

$$I = V7\text{-}8/R7\text{-}8 \qquad (1)$$

Furthermore, assuming that the resistance between the node N1 and the node N4 located at both ends of the three resistor strings RS1, RS2 and RS3 is R1-4, the potential difference V1-4 between the node N1 and the node N4 always becomes a constant value, and it is represented by the following equation 2.

$$V1\text{-}4 = V7\text{-}8 \times R1\text{-}4/R7\text{-}8 \qquad (2)$$

In the digital-analog conversion circuit shown in FIG. 3, the potential of the node N1 and the potential of the node N4 can be changed by the above described action while keeping the potential difference between ends (node N1 and node N4) of the resistor strings RS1, RS2 and RS3 constant.

By using the resistor string digital-analog conversion circuit including the resistor strings RS1, RS2 and RS3, the first controller 21, and the switch group SW, an analog output corresponding to the m high-order bits of the input digital signal is obtained. Furthermore, an analog output corresponding to the n low-order bits of the input digital signal is determined by changes of the potential of the node N1 and the potential of the node N4.

According to the present invention, therefore, it is not necessary to provide a switch group for obtaining the analog output corresponding to the n low-order bits of the input digital signal in series to the resistor string, unlike the conventional technique. Therefore, an increase of the circuit area which poses a problem in the case where the conventional digital-analog conversion circuit is activated with a low power supply voltage can be suppressed.

Other objects and features of this invention will become apparent from the following description with reference to the accompanying drawings.

DESCRIPTION OF THE PREFERRED EMBODIMENTS

Figure 4:
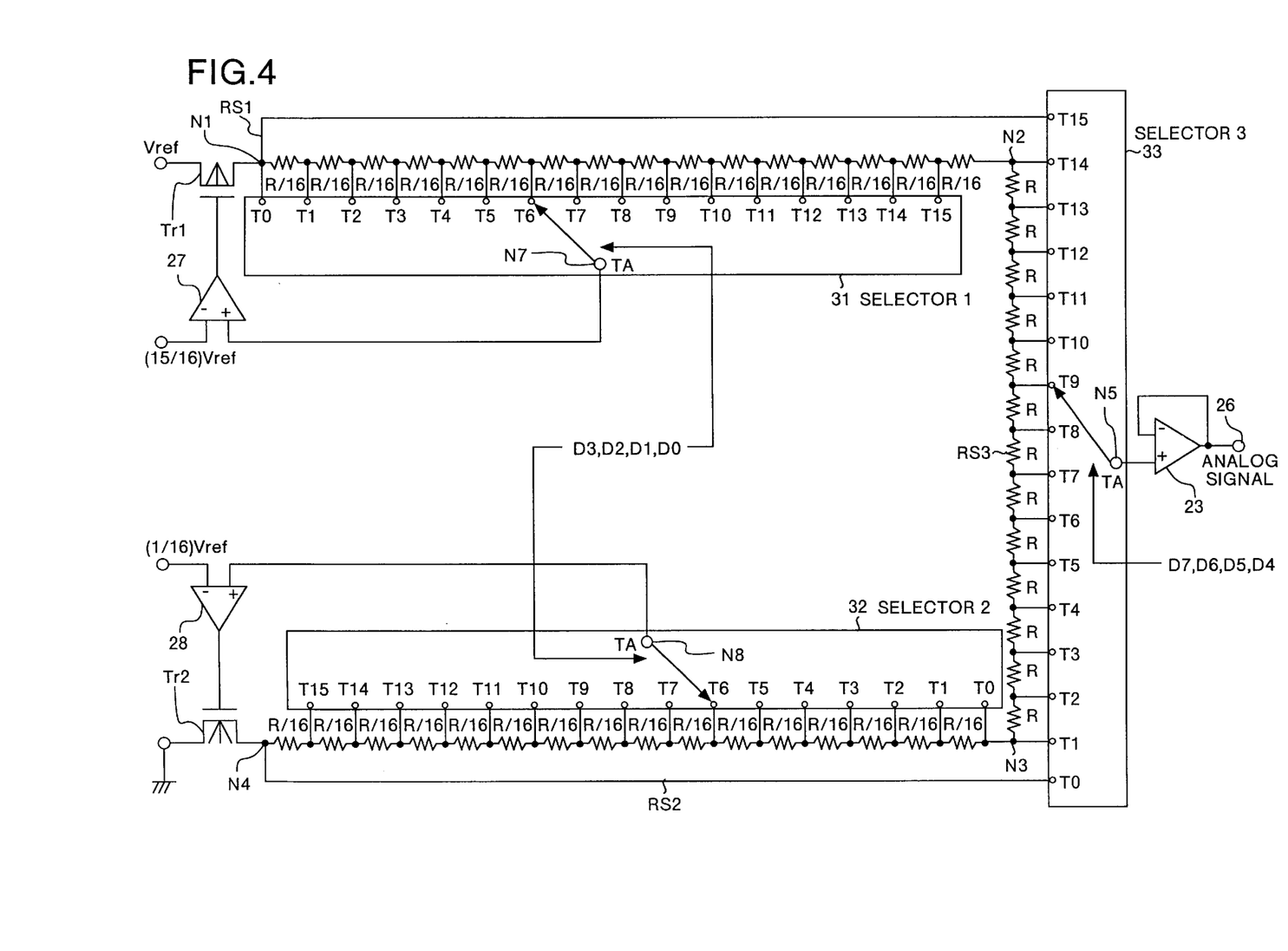
FIG. 4 is a circuit diagram showing an embodiment of a digital-analog conversion circuit according to the present invention.

Hereafter, an example in which the present invention is applied to an 8-bit digital-analog conversion circuit will be described in detail by referring to drawing. FIG. 4 is a circuit diagram showing an embodiment of a digital-analog conversion circuit according to the present invention.

This digital-analog conversion circuit includes three resistor strings RS1, RS2 and RS3, a first selector 31, a second selector 32, a third selector 33, a first differential amplifier 27, a first transistor Tr1 formed of, for example, a PMOS, a second differential amplifier 28, a second transistor Tr2 formed of, for example, an NMOS, a buffer 23, and an output terminal 26.

Furthermore, this digital-analog conversion circuit includes an input terminal supplied with high-order bits (for example, D7, D6, D5 and D4) of a digital signal and an input terminal supplied with low-order bits (for example, D3, D2, D1 and D0). In FIG. 4, however, those input terminals (terminals denoted by the numerals 24 and 25 in FIG. 3) are omitted and not shown. The components that are same or similar to those shown in FIG. 3 are denoted by like characters, and duplicated description will be omitted.

In this embodiment, the first selector 31 corresponds to the second controller 22 (see FIG. 3) and the first switch group S1 (see FIG. 3). The second selector 32 corresponds to the second controller 22 (see FIG. 3) and the second switch group S2 (see FIG. 3). The third selector 33 corresponds to the first controller 21 (see FIG. 3) and the switch group SW (see FIG. 3).

The first resistor string RS1 has such a configuration that 16 resistors each having a resistance value of $(1/16)R$ are connected in series between the node N1 and the node N2. A terminal of a resistor located on a highest potential side among those 16 resistors is connected to a drain of the first transistor Tr1. A power supply potential Vref is applied to a source of the first transistor Tr1. An output signal of the first differential amplifier 27 is inputted into a gate of the first transistor Tr1.

Here, a tap T0 of the first selector 31 is connected to a connection point corresponding to a terminal of a resistor located on the highest potential side (node N1 side) in the first resistor string RS1, i.e., a connection point corresponding to the node N1. A tap T15 of the selector 31 is connected to a connection point between this resistor and its adjacent resistor. Subsequently, taps of the selector 31 are connected to connection points with respective adjacent resistors. And a tap T15 of the selector 31 is connected to a connection point between a resistor located on a lowest potential side (node N2 side) in the first resistor string RS1 and an immediately preceding resistor. A tap TA of the selector 31 is connected to a non-inverting input terminal (node N7) of the first differential amplifier 27.

The first selector 31 has such a configuration as to switch over the tap TA to one of the tap T0 to T15 according to the low-order bits (for example, D3, D2, D1 and D0) of the input digital signal. An inverting input terminal of the first differential amplifier 27 is supplied with a potential corresponding to $15/16$ of the power supply potential Vref, i.e., $(15/16) \cdot Vref$.

The second resistor string RS2 has such a configuration that 16 resistors each having a resistance $(1/16) \cdot R$ are connected in series between the node N3 and the node N4. A terminal of a resistor located on a lowest potential side among those 16 resistors is connected to a drain of the second transistor Tr2. A source of the second transistor Tr2 is grounded. An output signal of the second differential amplifier 28 is inputted into a gate of the second transistor Tr2.

In the second selector 32 as well, a tap T0 is connected to a connection point corresponding to a terminal of a resistor located on the highest potential side (node N3 side) in the second resistor string RS2, i.e., a connection point corresponding to the node N3, in the same way as the first selector 31. Subsequently, taps of the selector 32 are connected to connection points with respective adjacent resistors. A taps TA of the selector 32 is connected to a non-inverting input terminal (node N8) of the second differential amplifier 28.

The second selector 32 has such a configuration as to switch over the tap TA to one of the tap T0 to T15 according to the low-order bits (for example, D3, D2, D1 and D0) of the input digital signal. An inverting input terminal of the second differential amplifier 28 is supplied with a potential corresponding to $1/16$ of the power supply potential Vref, i.e., $(1/16) \cdot Vref$.

The first selector 31 and the second selector 32 conduct switch over operation so as to keep a resistance value between node N7 and N8 at 14R.

For example, when the non-inverting input terminal of the first differential amplifier 27 is connected to the connection point T6 of the first resistor string RS1 through the node N7, the non-inverting input terminal of the second differential amplifier 28 is connected to the connection point T6 of the second resistor string RS2 through the node N8.

The third resistor string RS3 has such a configuration that 13 resistors each having a resistance R are connected in series between the node N2 and the node N3. A tap T0 of the third selector 33 is connected to the node N4. A tap T1 of the selector 33 is connected to a connection point corresponding to a terminal of a resistor located on the lowest potential side (node N3 side) in the third resistor string RS3, i.e., a connection point corresponding to the node N3. Subsequently, taps of the selector 33 are connected to connection points with respective adjacent resistors. A tap T15 of the selector 33 is connected to the node N1. A tap TA of the selector 33 is connected to a node N5, which is connected to the output terminal 26 via the buffer 23.

The third selector 33 has such a configuration as to switch over the tap TA to one of the tap T0 to T15 according to the high-order bits (for example, D7, D6, D5 and D4) of the input digital signal.

Figure 5:
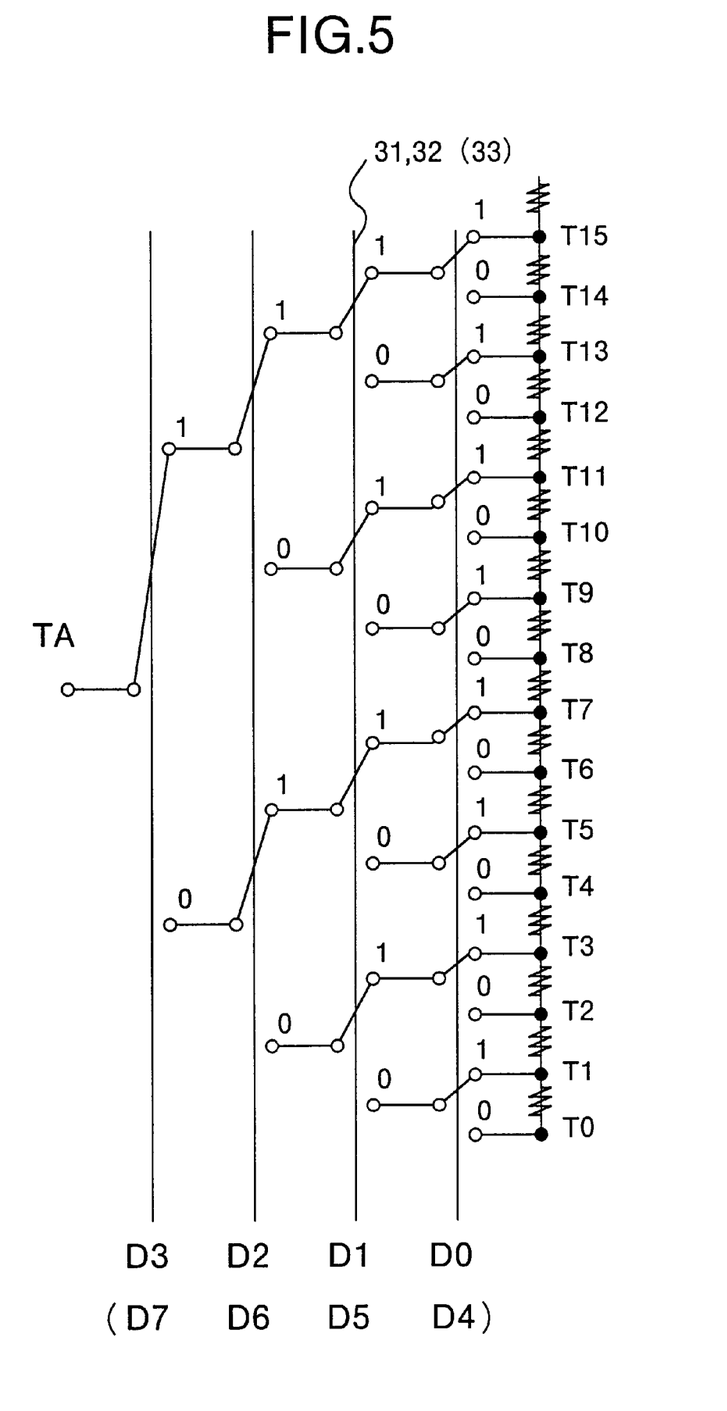
FIG. 5 is a schematic diagram showing an example of a selector in the digital-analog conversion circuit shown in FIG. 4.

FIG. 5 is a schematic diagram showing an example of the first selector 31 or the second selector 32. The first selector 31 or the second selector 32 includes an analog selector for switching-over to "0" or "1" in order, from a high-order bit side of low-order bits, such as "D3, D2, D1 and D0," of the input digital signal.

When the digital signal D3, D2, D1 and D0 is 1111, a tap TA is connected to the tap T15. As the digital signal value becomes smaller, a point of connection with the tap TA is successively switched over to T14, T13, ..., T1. When the digital signal D3, D2, D1 and D0 is 0000, the tap TA is connected to the tap T0.

The third selector 33 has a configuration similar to the configuration shown in FIG. 5. The third selector 33 includes an analog selector for switching over to "0" or "1" in order, from a high-order bit side of high-order bits, such as D7, D6, D5 and D4, of the input digital signal. When the digital signal D7, D6, D5 and D4 is 1111, a tap TA is connected to the tap T15. As the digital signal value becomes smaller, a point of connection with the tap TA is successively switched over to T14, T13, ..., T1. When the digital signal D7, D6, D5 and D4 is 0000, the tap TA is connected to the tap T0.

Figure 6:
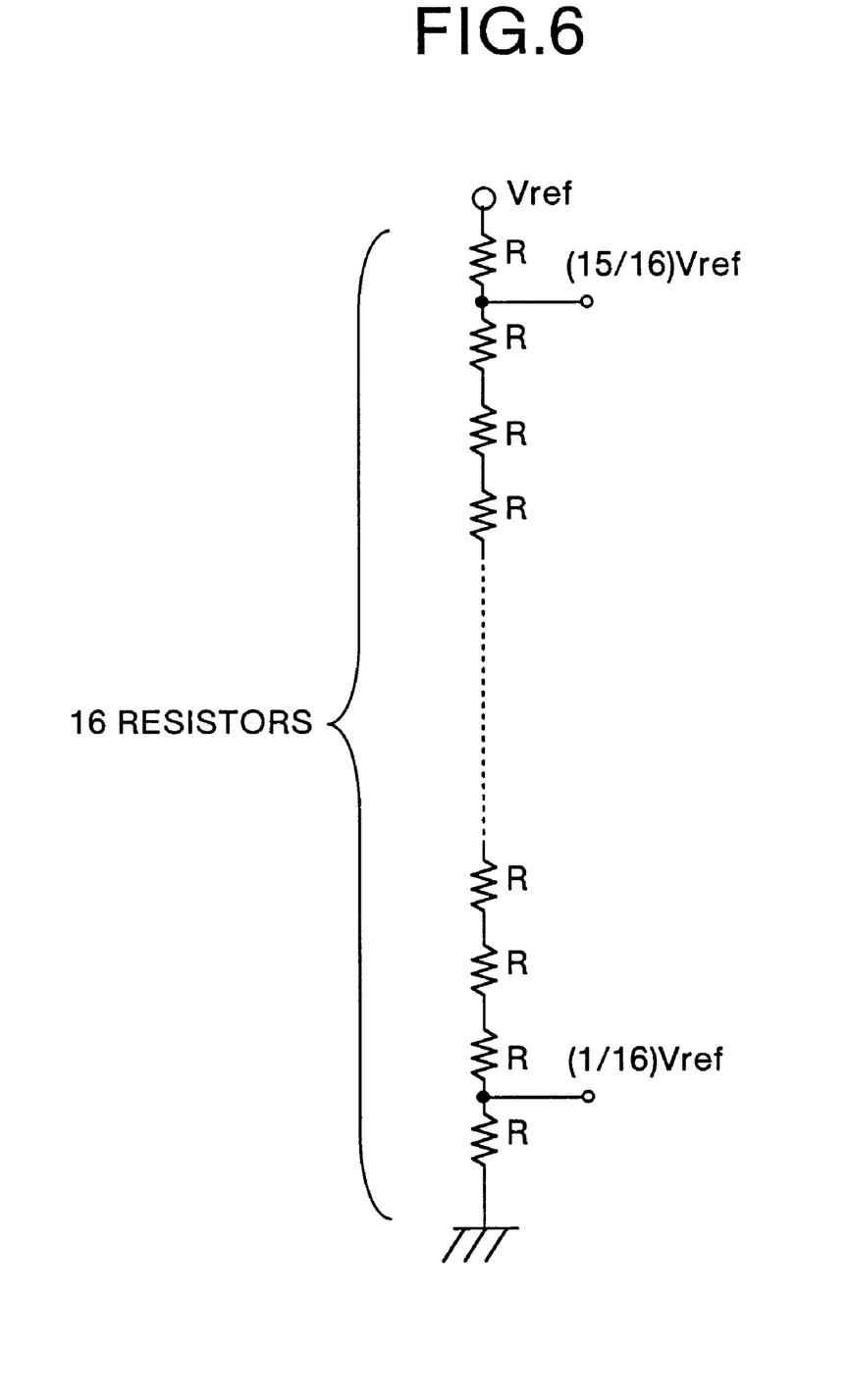
FIG. 6 is a schematic diagram showing an example of a potential generation circuit in the digital-analog conversion circuit shown in FIG. 4.

FIG. 6 is a schematic diagram showing an example of a potential generation circuit which may be used in the digital-analog conversion circuit shown in FIG. 4. This potential generation circuit generates the potential corresponding to $15/16$ of the power supply potential Vref, and the potential corresponding to $1/16$ of the power supply potential Vref. In this potential generation circuit, 16 resistors each having the same resistance R are connected in series, one end of this series is supplied with the power supply potential Vref, and the other end is grounded.

In this potential generation circuit, a potential lower than the high potential side by a voltage drop of one resistor is the potential $(15/16) \cdot Vref$ applied to the inverting input terminal of the first differential amplifier 27. Furthermore, a potential higher than the low potential side by a voltage drop of one resistor is the potential $(1/16) \cdot Vref$ applied to the inverting input terminal of the second differential amplifier 28.

Although not restricted, the example shown in FIG. 4 shows the case where the input digital signal is 10010110(2).

In other words, D7=1, D6=0, D5=0, D4=1, D3=0, D2=1, D1=1, D0=0. This value is equal to 150(10). Here, (2) and (10) indicate that the value is a binary value and a decimal value, respectively.

Furthermore, in the present embodiment, an 8-bit input digital signal is divided into 4 high-order bits and 4 low-order bits. Hereafter, as its reason, a-bit division method applied to the digital-analog conversion circuit according to the present invention will be described.

It is now assumed that N-bit digital signal is divided into m high-order bits and n low-order bits and the area of the resistor element corresponding to 1 LSB is Sr. In this case, the total area of the resistor elements ΣSr is represented by the following equation 3.

$$\Sigma Sr = 2^n \cdot (2^m - 1) \cdot Sr \quad (3)$$

Here, $n \leq N-2$.

Furthermore, assuming that the area per switch element used in the selector shown in FIG. 5 is Ss, the total area ΣSs of the switch elements is represented by the following equation 4.

$$\Sigma Ss = (2^m + 2^{n+1} - 3) \cdot Ss \quad (4)$$

Assuming now that Sr is nearly equal to Ss and N to be equal to 8, the total area of the resistors and the switch elements become minimum when m=n=4. Values of m and n can be derived in the same way even if N is not equal to 8 as well. Further, Values of m and n can be derived in the same way even if Sr and Ss are not equal to each other.

Operation of this circuit will now be described by taking the case where the value of the input digital signal is 10010110(2) (see FIG. 4) as an example. Since the lower-order bits are 0110, the node N7 is connected to the connection point of T6 of the first resistor string RS1 by the first selector 31. Therefore, the potential of the node N7 becomes equal to a potential VRS1-T6 of the connection point T6 of the first resistor string RS1.

In the first differential amplifier 27, a difference between the potential VRS1-T6 of the node N7 and a potential corresponding to $^{15}/_{16}$ of the power supply potential Vref, i.e., $(^{15}/_{16})$ Vref is amplified. And a potential corresponding to the difference is applied to the gate of the first transistor Tr1 as the output signal of the first differential amplifier 27.

If at that time the potential VRS1-T6 of the node N7 is higher than $(^{15}/_{16}) \cdot$Vref, then the potential applied to the gate of the first transistor Tr1 rises, and consequently the potential difference between the source and drain of the first transistor Tr1 becomes great. As a result, the potential VRS1-T6 of the node N7 becomes low and approaches $(^{15}/_{16}) \cdot$Vref.

On the other hand, if the potential VRS1-T6 of the node N7 is lower than $(^{15}/_{16})$ Vref, then the potential applied to the gate of the first transistor Tr1 falls, and consequently the potential difference between the source and drain of the first transistor Tr1 becomes small. As a result, the potential VRS1-T6 of the node N7 becomes high and approaches $(^{15}/_{16}) \cdot$Vref. By such a feedback control, the potential VRS1-T6 of the node N7 becomes equal to $(^{15}/_{16}) \cdot$Vref.

In the same way, the node N8 is connected to the connection point of T6 of the second resistor string RS2 by the second selector 32. As a result, the potential of the node N8 becomes equal to a potential VRS2-T6 of the connection point T6 of the resistor string RS2. By the same feedback control as that of the first selector 31, the potential VRS2-T6 of the node N8 becomes equal to $(^{1}/_{16}) \cdot$Vref.

Furthermore, the first selector 31 and the second selector 32 conduct switchover operation of respective connection points so as to always keep a resistance value of a path extending from the node N7 to the node N8 through the first to third resistor strings RS1, RS2 and RS3 at 14R.

A potential difference between the node N7 and N8 corresponds to $^{14}/_{16}$ of the power supply potential Vref, i.e., $(^{14}/_{16}) \cdot$Vref. Therefore, a constant current Vref/(16·R) flows from the node N1 to the node N4.

Since the high-order bits are 1001, the node N5 is connected to the connection point of T9 of the third resistor string RS3 by the third selector 33. Therefore, a potential of the node N5 becomes equal to a potential VRS3-T9 of the connection point T9 of the third resistor string RS3.

The resistance between the connection point T9 of the third resistor string RS3 and the connection point T6 of the second resistor string RS2 is $^{134}/_{16}$ of R (i.e., $(^{134}/_{16}) \cdot$R). And a current flowing through this is Vref/(16·R) as described above.

Therefore, a potential difference between the connection point T9 of the third resistor string RS3 and the connection point T6 of the second resistor string RS2 becomes $^{134}/_{256}$ of the power supply potential Vref, i.e., $(^{134}/_{256}) \cdot$Vref. Furthermore, the potential VRS2-T6 of the connection point T6 of the second resistor string RS2 is $(^{1}/_{16}) \cdot$Vref as described above.

Therefore, a potential at the connection point T9 of the third resistor string RS3 which becomes the output of the digital-analog conversion circuit of the present embodiment becomes $^{150}/_{256}$ of the power supply potential Vref, i.e., $(^{150}/_{256}) \cdot$Vref. In other words, an analog output corresponding to a value 150(10) of the input digital signal is obtained.

In this embodiment, potentials of the node N1 and the node N4 can be changed while keeping the potential difference between ends (the node N1 and the node N4) of the resistor strings RS1, RS2 and RS3 constant.

And the analog output corresponding to the m high-order bits of the input digital signal is obtained by using the resister string digital-analog conversion circuit including the resistor strings RS1, RS2 and RS3 and the third selector 33. Furthermore, the analog output corresponding to the n low-order bits of the input digital signal is determined by the changes of potentials of the node N1 and the node N4.

Unlike the conventional technique, therefore, it is not necessary to provide the switch group for obtaining the analog output corresponding to the n low-order bits of the input digital signal, connected in series with the resistor string. As a result, there can be suppressed the increase of the circuit area which poses a problem in the case where the conventional digital-analog conversion circuit is activated with a low power supply voltage.

A result of comparison of the area of the digital-analog conversion circuit shown in FIG. 4 and the conventional digital-analog conversion circuit shown in FIG. 1 will be now described. It will be assumed here that the area of the entire conventional digital-analog conversion circuit is 100%. In the conventional circuit, the area occupied by the switch elements (MOS transistors) for converting the n low-order bits of the input digital signal to an analog signal is 90%. However, in the circuit of the present embodiment, it is approximately 17%.

Furthermore, in the circuit of the present embodiment, the first and second differential amplifiers 27 and 28 are newly provided. However, the area occupied by these differential amplifiers 27 and 28 is approximately 26% of the area of the entire conventional digital-analog conversion circuit. As a whole, therefore, the area of the digital-analog conversion circuit of the present embodiment is approximately 53(= 100−90+17+26)% of the conventional circuit. In other words, the digital-analog conversion circuit of the present embodiment is nearly half in size as compared with the conventional digital-analog conversion circuit.

It is mentioned above that the first transistor Tr1 and the second transistor Tr2 are PMOS and NMOS, respectively. However, the first transistor Tr1 and the second transistor Tr2 may be NMOS and PMOS, respectively. In this case, input characteristics of the first and second differential amplifiers 27 and 28 need to be inverted.

Furthermore, it is mentioned above that the first transistor Tr1 and the second transistor Tr2 are both MOS transistors. As a matter of course, however, the first transistor Tr1 and the second transistor Tr2 are not restricted to them.

Furthermore, the present invention is not restricted to a digital-analog conversion circuit for 8 bit, but can be applied to digital-analog conversion circuits for various numbers of bits. When the input digital signal is divided into m high-order bits and n low-order bits, each of the first and second resistor strings RS1 and RS2 has such a configuration that $2^n$ resistors each having a resistance value of $R/2^n$ are connected in series. The third resistor string RS3 has such a configuration that $2^m-3$ resistors each having a resistance value of R are connected in series, where $m \geq 2$.

In addition, inverting input terminals of the first differential amplifier 27 and the second differential amplifier 28 are supplied with a potential of $Vref-Vref/2^m$ and a potential of $Vref/2^m$. Furthermore, the first selector 31 and the second selector 32 need to be selected so as to always make the resistance value of the resistor strings RS1, RS2 and RS3 between the node N7 and the node N8 a constant value $(2^m-2) \cdot R$.

Unlike the conventional technique, in the present invention, it is not necessary to provide a switch group for obtaining an analog output corresponding to the n low-order bits of the input digital signal, connected in series with the resistor string. As a consequence, even if the digital-analog circuit is activated with a low power supply voltage, therefore, an increase of the circuit area can be suppressed.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A digital-analog conversion circuit comprising:

a first resistor string;

a second resistor string;

a third resistor string connected in series between said first resistor string and said second resistor string;

a switch group which switches over connection points of output terminals for said first resistor string, said second resistor string, and said third resistor string;

a first controller which controls the connection point switchover conducted by said switch group in response to a first digital signal;

a first variable voltage source which applies a desired potential to a terminal of said first resistor string which is not connected to said third resistor string;

a second variable voltage source which applies a desired potential to a terminal of said second resistor string which is not connected to said third resistor string; and a second controller which keeps a potential difference between the terminal of said first resistor string which is not connected to said third resistor string and the terminal of said second resistor string which is not connected to said third resistor string constant, and changes an output voltage of said first variable voltage source and an output voltage of said second variable voltage source according to a second digital signal;

wherein said first variable voltage source comprises a first constant voltage source; a second constant voltage source; a first switch group which switches over the connection point with respect to said first resistor string; a first differential amplifier which outputs a difference between a potential at a connection point of said first switch group with said first resistor string and a potential of said second constant voltage source; and a first transistor which changes a resistance value between said first constant voltage source and the terminal of said first resistor string which is not connected to said third resistor string so as to make the potential at the connection point of said first switch group with said first resistor string equal to the potential of said second constant voltage source according to an output of said first differential amplifier, said second variable voltage source comprises a third constant voltage source; a fourth constant voltage source; a second switch group which switches over the connection point with respect to said second resistor string; a second differential amplifier which outputs a difference between a potential at a connection point of said second switch group with said second resistor string and a potential of said fourth constant voltage source; and a second transistor which changes a resistance value between said third constant voltage source and the terminal of said second resistor string which is not connected to said third resistor string so as to make the potential at the connection point of said second switch group with said second resistor string equal to the potential of said fourth constant voltage source according to an output of said second differential amplifier, and said second controller controls switchover of the connection point of said first switch group with said first resistor string and the connection point of said second switch group with said second resistor string so as to make a resistance value between the connection point of said first switch group with said first resistor string and the connection point of said second switch group with said second resistor string constant.

2. The digital-analog conversion circuit according to claim 1, wherein said first transistor is a MOS transistor of which one of a source and a drain connected to said first constant voltage source, the other of the source and the drain connected to the terminal of said first resistor string which is not connected to said third resistor string, and a gate supplied with an output voltage of said first differential amplifier, and said second transistor is a MOS transistor of which one of a source and a drain connected to said third constant voltage source, the other of the source and the drain connected to the terminal of said second resistor string which is not connected to said third resistor string, and a gate supplied with an output voltage of said second differential amplifier.

3. The digital-analog conversion circuit according to claim 2, wherein one of said first transistor and said second transistor is an NMOS transistor and the other is a PMOS transistor.

4. The digital-analog conversion circuit according to claim 1, wherein said first controller and said switch group, said second controller and said first switch group, and said second controller and said second switch group form analog selectors, respectively.

5. The digital-analog conversion circuit according to claim 1, wherein said first digital signal is a signal formed of high-order bits of an input digital signal, and said second digital signal is a signal formed of remaining low-order bits of the input digital signal.

6. The digital-analog conversion circuit according to claim 1, wherein said first digital signal is a signal formed of m high-order bits of an input digital signal, where m is at least 2, said second digital signal is a signal formed of n remaining low-order bits of the input digital signal, said third resistor string has such a configuration that $2^m-3$ resistor elements each having a resistance value R are connected in series, each of said first resistor string and said second resistor string has such a configuration that $2^n$ resistor elements each having a resistance value $R/2^n$ are connected in series, when the potential of said first constant voltage source is V1 and the potential of said third constant voltage source is V3, said second constant voltage source has a potential of $V1-(V1-V3)/2^m$, said fourth constant voltage source has a potential of $V3+(V1-V3)/2^m$, and said second controller controls switchover of the connection point of said first switch group with said first resistor string and the connection point of said second switch group with said second resistor string so as to make a resistance value between the connection point of said first switch group with said first resistor string and the connection point of said second switch group with said second resistor string equal to $(2^m-2)\cdot R$.

7. A digital-analog conversion circuit comprising:

a first resistor string;

a second resistor string;

a third resistor string which is connected in series between one end of said first resistor string and one end of said second resistor string and;

a first selector which connects one of a plurality of connection nodes of said first resistor string with a first output terminal;

a second selector which connects one of a plurality of connection nodes of said second resistor string with a second output terminal;

a third selector which connects one of a plurality of connection nodes of said third resistor string with a third output terminal;

a first variable voltage source which supplies a potential corresponding to the connection node connected with said first output terminal by said first selector to the other end of said first resistor string;

a second variable voltage source which supplies a potential corresponding to the connection node connected with said second output terminal by said second selector to the other end of said second resistor string;

a first controller which controls said third selector in response to high-order bits of an input digital signal; and a second controller which controls said first selector and said second selector in response to remaining low-order bits of the input digital signal so as to keep a potential difference between an output of said first variable voltage source and an output of said second variable voltage source constant and change the output of said first variable voltage source and the output of said second variable voltage source according to said low-order bits.

8. The digital-analog conversion circuit according to claim 7, wherein said first variable voltage source including a first constant voltage source;

a first reference voltage source;

a first differential amplifier which outputs a voltage corresponding to a difference between an output of said first output terminal and an output of said first reference voltage source;

a first transistor which changes a resistance value thereof in response to an output of said first differential amplifier so as to make the output of said first output terminal equal to the output of said first reference voltage source, and wherein said second variable voltage source including a second constant voltage source;

a second reference voltage source;

a second differential amplifier which outputs a voltage corresponding to a difference between an output of said second output terminal and an output of said second reference voltage source;

a second transistor which changes a resistance value thereof in response to an output of said second differential amplifier so as to make the output of said second output terminal equal to the output of said second reference voltage source.

9. The digital-analog conversion circuit according to claim 8, wherein said first transistor is a MOS transistor, wherein one of a source and a drain of said first transistor is connected to said first constant voltage source, the other is connected to the other end of said first resistor string, and a gate of said first transistor is supplied with the output of said first differential amplifier; and said second transistor is a MOS transistor, wherein one of a source and a drain of said second transistor is connected to said second constant voltage source, the other is connected to the other end of said second resistor string, and a gate of said second transistor is supplied with the output of said second differential amplifier.

* * * * *